United States Patent [19]
Debaty

[11] Patent Number: 5,343,169
[45] Date of Patent: Aug. 30, 1994

[54] FREQUENCY LOCKED LOOP

[75] Inventor: Pascal Debaty, Domene, France

[73] Assignee: SGS-Thomson Microelectronics S.A., Saint-Genis Pouilly, France

[21] Appl. No.: 37,352

[22] Filed: Mar. 25, 1993

[30] Foreign Application Priority Data

Mar. 31, 1992 [FR] France .................. 92 04261

[51] Int. Cl.$^5$ .................................. H03L 7/00
[52] U.S. Cl. ...................... 331/17; 331/34; 331/1 A
[58] Field of Search ................ 331/17, 34, 109

[56] References Cited

U.S. PATENT DOCUMENTS

| | | | |
|---|---|---|---|
| 4,420,723 | 12/1983 | De Jager | 331/20 |
| 4,987,387 | 1/1991 | Kennedy | 331/1 A |
| 5,043,677 | 8/1991 | Tomassetti et al. | 331/20 |
| 5,075,640 | 12/1991 | Miyazawa | 331/10 |
| 5,103,191 | 4/1992 | Werker | 331/1 A |
| 5,119,043 | 6/1992 | Borwn et al. | 331/16 |
| 5,157,355 | 10/1992 | Shikakura et al. | 331/14 |
| 5,168,245 | 12/1992 | Koskowich | 331/17 |
| 5,170,135 | 12/1992 | Ito et al. | 331/17 |
| 5,208,555 | 5/1993 | Graham et al. | 331/1 A |
| 5,268,655 | 12/1993 | Dong | 331/17 |
| 5,270,669 | 12/1993 | Jokura | 331/20 |

FOREIGN PATENT DOCUMENTS 2564664 11/1985 France .

OTHER PUBLICATIONS

Patent Abstracts of japan, vol. 12, No. 24 (E-576) Jan. 23, 1988 & JP-A-62 179 756 (Sanyo Electric).
Transactions of the Institute of Electronics and Communication Engineers of Japan, Section E, vol. E63, No. 5, May 1980, Tokyo JP pp. 367-368, Taiichiro Kurita, et al. "A Digital Phase-Locked Loop with AND Filter".

*Primary Examiner*—Raymond A. Nelli
*Attorney, Agent, or Firm*—Wolf, Greenfield & Sacks

[57] ABSTRACT

A frequency locked loop includes a phase comparator receiving first and second periodic signals and having a first output providing pulses if the first signal is in phase advance with respect to the second signal and a second output providing pulses in the opposite case; an oscillator providing the second signal; a counter, the state of which determines the frequency of the oscillator, having an incrementation input and a decrementation input; and a sampling circuit for transmitting each Nth of the pulses either to the incrementation input if the pulse occurs at one of the first and second outputs of the comparator, or to the decrementation input if the pulse occurs at the other of the first and second outputs.

19 Claims, 3 Drawing Sheets

FREQUENCY LOCKED LOOP

BACKGROUND OF THE INVENTION

1. Field of the Invention

The present invention relates to phase locked loops (PLL's) and more particularly to PLL's including a two-input/two-output phase comparator, the first output providing a signal when the first input is in phase advance with respect to the second, and the second output providing a signal when the second input is in phase advance with respect to the first input.

2. Discussion of the Related Art

FIG. 1 is a simplified diagram of an exemplary conventional so-called "charge-pump" PLL.

A phase comparator (PFD) 10 receives at a first input a logic signal Fext, and at a second input a logic signal Fvco provided by a voltage-controlled oscillator (VCO) 12. Comparator 10 is generally sensitive to the falling edges of signals Fext and Fvco. A charge-pump includes two current sources 14, 15 of equal value I, for charging or discharging capacitors that may be included in a filter 17. Sources 14 and 15 are disposed in series between a high voltage Vcc and a low voltage Vss and are respectively controlled by an UP output and a DOWN output of the phase comparator 10. The junction between sources 14 and 15 is connected to the control input of oscillator 12 and to filter 17 which is connected to a reference voltage G, such as ground. Filter 17 generally includes an integration capacitor C1 disposed in series with a correction cell including a resistor R and a capacitor C2 interconnected in parallel.

The UP output of phase comparator 10 provides pulses (UP pulses) having a duration equal to the phase advance of signal Fext with respect to signal Fvco. The DOWN output provides pulses (DOWN pulses) having a duration equal to the phase lag of signal Fext with respect to signal Fvco. Thus, the capacitors of filter 17, especially capacitor C1 which has a high value with respect to capacitor C2, are progressively charged or discharged in accordance with the phase relation between signals Fext and Fvco. Voltage Vc across filter 17, which varies as a function of this phase relation, corrects the frequency of VCO 12 in order to catch-up the phase error of signal Fvco. The correction cell R, C2 provides, during each rising edge of an UP or DOWN pulse, a voltage peak to briefly overcorrect the VCO 12.

FIG. 2 shows signals Fext, Fvco, UP and DOWN corresponding to an exemplary case. For the sake of simplification of the drawings, signals Fext and Fvco are represented in the form of pulses having a practically zero duration. Signal Fext is represented as having a constant frequency. Each pulse of signal Fext is marked $E_n$; the corresponding pulse of signal Fvco is marked $V_n$, index n being an integer representing the pulse rank.

At a time $t_0$, a pulse $V_0$ of signal Fvco is provided before the corresponding pulse $E_0$ of signal Fext. Comparator 10 then detects a phase advance of signal Fvco with respect to signal Fext and provides an active DOWN pulse from pulse $V_0$ up to pulse $E_0$, which causes the frequency of signal Fvco to decrease. The next pulse $V_1$ is still in advance with respect to pulse $E_1$. Then, a new DOWN pulse occurs and causes the frequency of signal Fvco to decrease again, and so forth. This first step during which DOWN pulses are generated is continued until a phase coincidence is obtained between pulses $E_{i-1}$ and $V_{i-1}$ at a time $t_1$.

Then, a second step during which UP pulses are generated is initiated. From the timing of pulses $E_i$ and $V_i$, it is determined that signal Fvco is in phase lag with respect to signal Fext. The PLL compensates for this phase lag by increasing the frequency of signal Fvco responsive to the generated UP pulses, until signal Fvco is again in phase advance with respect to signal Fext.

The two preceding steps alternatively occur until signals Fext and Fvco are in synchronism. Before reaching such synchronism, the frequency of signal Fvco oscillates about the frequency of signal Fext.

FIG. 3A shows the waveform of the frequency variation of signal Fvco in the case of a phase shift of signal Fext after signals Fext and Fvco are initially in synchronism. This situation corresponds for example to that of FIG. 2 and may be caused by a missing pulse ($E_{00}$ in FIG. 2) from signal Fext. In the case of a missing pulse E, the PLL "considers" the situation as though signal Fvco was in a phase advance of one period.

At time $t_0$ the phase shift of signal Fext occurs. From time $t_0$, the frequency of signal Fvco starts oscillating about the frequency of signal Fext and slowly tends to this frequency. Times $t_0$ and $t_1$ of FIG. 3 correspond to times $t_0$ and $t_1$ of FIG. 2.

FIG. 3B illustrates the frequency waveform of signal Fvco when the frequency of signal Fext shifts at a time $t_0$ up to an upper value. From time $t_0$, the frequency of signal Fvco increases, exceeds the new frequency of signal Fext, and then oscillates about the new frequency and slowly tends up to the new frequency.

If, in FIG. 3B, time $t_0$ corresponds to a starting of the loop, the situation of FIG. 2 can be found, that is, signal Fvco is in phase advance with respect to signal Fext but is at a lower frequency. Then, as shown in dashed lines, the frequency of signal Fvco starts decreasing, that is, it initially varies in a direction opposite to the desired direction.

It can be appreciated that the PLL tends to rapidly compensate for the phase error between signals Fext and Fvco by modifying the frequency of signal Fvco at each pulse, with the resulting drawback of causing the frequency of signal Fvco to oscillate. The oscillation duration and the amplitude thereof increase as the initial phase error increases. A phase shift or a missing pulse substantially disturbs the loop, even if signals Fext and Fvco are in synchronism.

The frequency of signal Fvco may not even converge in the direction of signal Fext during a specific perturbation or if some of the components are incorrectly selected. The components of filter 17 must be carefully chosen so as to make trade-offs between stability and speed of synchronization.

Another drawback of the PLL's such as the one of FIG. 1 is that capacitors, especially capacitor $C_1$, and resistor R of filter 17 generally have high values and must be external to an integrated circuit including the other elements of the PLL.

SUMMARY OF THE INVENTION

An object of the present invention is to provide a frequency locked loop, little sensitive to phase perturbations.

Another object of the invention is to provide such a frequency locked loop having a monotonously converging frequency.

Another object of the invention is to provide such a frequency locked loop that does not require any adjustment.

A further object of the invention is to provide such a completely integratable frequency locked loop.

These objects are achieved with a circuit using a phase comparator of the above mentioned type, but having a phase error indication that is sampled before modification of the frequency of a controlled oscillator. The sampling period is chosen so that each sample indicates not only a phase relation between the input signals of the phase comparator, but also, in a reliable manner, the direction in which the oscillator frequency has to vary in order to rapidly tend to frequency synchronization of the input signals.

The invention more particularly is directed to a frequency locked loop (FLL) including: a phase comparator receiving at the input first and second periodical signals and providing, at least at each period of the first or second signal, a phase error signal representative of the phase difference between the input signals; and an oscillator providing the second signal and controlled by a processing circuit for processing the phase error signal. According to the invention, the loop includes a sampling circuit disposed between the comparator and the processing circuit to provide the processing circuit with the phase error signal only at each $N^{th}$ period ($N>1$) of the first or second signal.

According to an embodiment of the invention, the oscillator frequency is variable by frequency steps and number N is chosen higher than the ratio between the nominal frequency of the first signal and a frequency step.

According to an embodiment of the invention, the phase comparator includes a first output providing pulses if the first signal is in phase advance with respect to the second signal, and a second output providing pulses if the second signal is in phase advance with respect to the first signal. The sampling circuit provides the processing circuit with each $N^{th}$ pulse.

According to an embodiment of the invention, the processing circuit includes a counter, the state of which fixes the oscillator frequency. The counter has an incrementation and a decrementation input. The sampling circuit includes means for transmitting each $N^{th}$ pulse, either to the incrementation input if the pulse occurs at one of the first and second outputs of the comparator, or to the decrementation input if the pulse occurs at the other output.

According to an embodiment of the invention, the loop includes a divider by N receiving at the input these pulses and controlling by its output two logic gates; the outputs of the two logic gates are respectively connected to the incrementation and decrementation inputs of the counter and respectively receive pulses from both first and second comparator outputs.

According to an embodiment of the invention, the gates are connected to the phase comparator through monostable flip-flops.

According to an embodiment of the invention, the divider is a divider by a programmable number N.

According to an embodiment of the invention, the oscillator includes an array of capacitors, each of which is connected or disconnected by the state of a bit of the counter.

The foregoing and other objects, features, aspects and advantages of the invention will become apparent from the following detailed description of the present invention which should be read in conjunction with the accompanying drawings.

DETAILED DESCRIPTION

Figure 2:
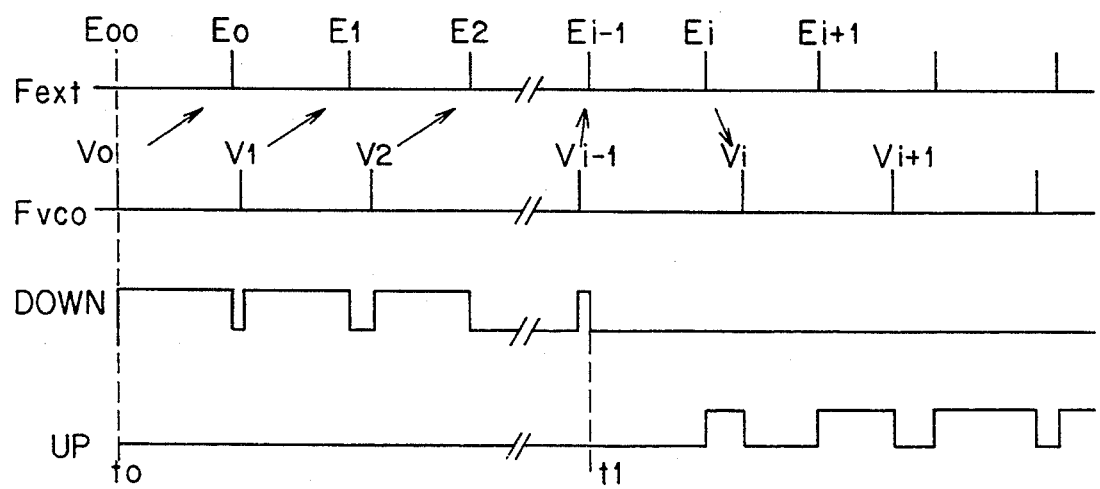
FIG. 2 schematically shows signal waveforms at various points of the circuit of FIG. 1.
Figure 3A:
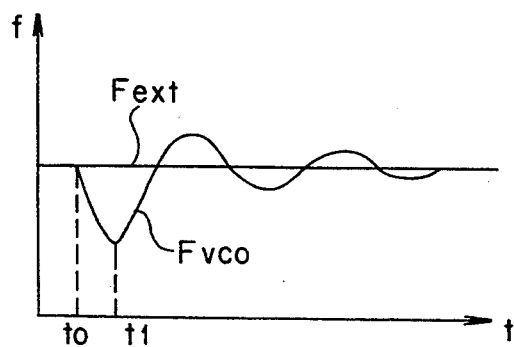
FIGS. 3A and 3B show response waveforms of the circuit of FIG. 1 during various perturbations.
Figure 3B:
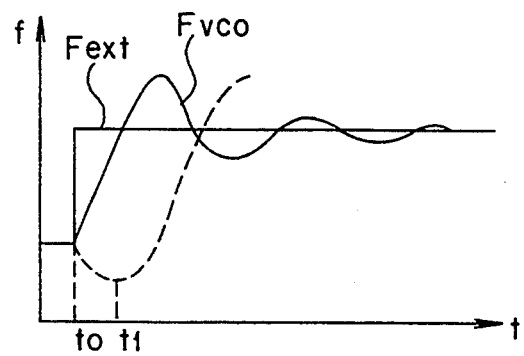
Figure 4:
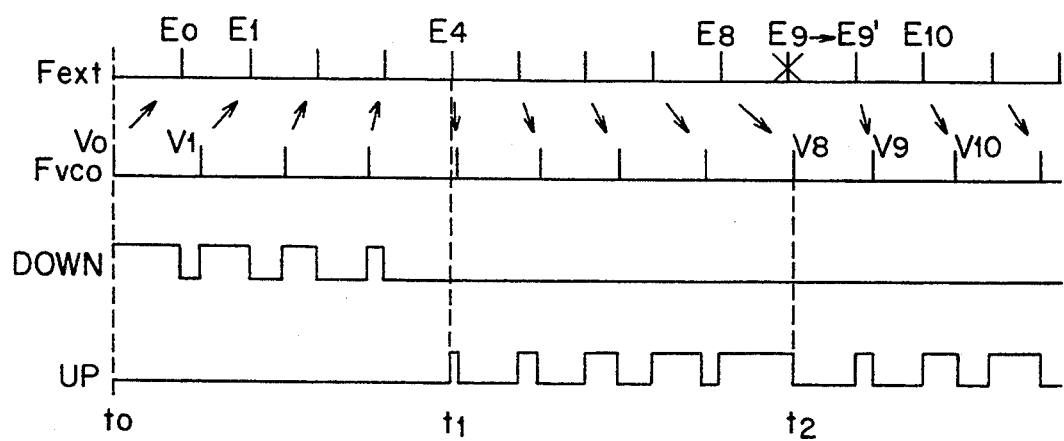
FIG. 4 illustrates signal waveforms in a case when these signals are not acted upon.

The present invention is based on the awareness that, in a conventional PLL, there does not exist at a given time, for the two signals to be synchronized, any correlation between a phase error and a frequency error, as shown in FIG. 2, at time $t_0$. However, the applicant has noted that, if the signals to be synchronized are observed for a sufficiently long period, at the end of this period, the phase error between these signals effectively indicates a frequency error, as shown in FIG. 4 from a time $t_1$. The purpose of the invention is to sample the phase error during periods when the phase error indicates a frequency error in order to correct the latter.

Figure 1:
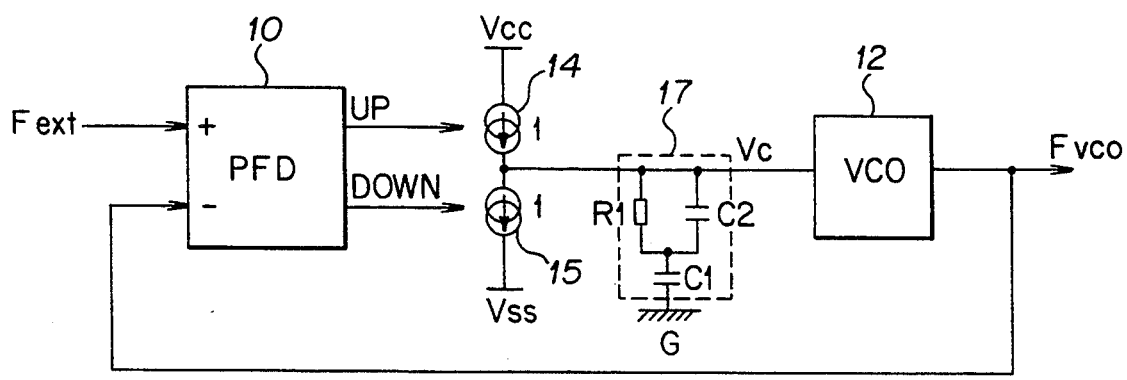
FIG. 1, above described, schematically shows a conventional charge-pump PLL.

FIG. 4 shows the output signals of a phase comparator such as the comparator of FIG. 1 in the specific case when signal Fvco is not acted upon. Same references as in FIG. 2 are used. Signal Fext is represented at a constant frequency; signal Fvco is represented at a lower constant frequency.

At a time $t_0$, a pulse $V_0$ from signal Fvco occurs before the corresponding pulse $E_0$ from signal Fext. Since the frequency of signal Fvco is constant and lower than that of signal Fext, this phase advance of signal Fvco is progressively compensated, as shown by the DOWN pulses of decreasing widths. At a time $t_1$, signal Fvco is in phase lag. Then, the phase lag progressively increases, as shown by the UP pulses of increasing widths. In theory, the widths of the UP pulses would increase to infinity.

In practice, this provides the situation represented about a time $t_2$. Just before time $t_2$, a pulse $E_8$ arrives before a corresponding pulse $V_8$. An UP pulse is normally generated between pulses $E_8$ and $V_8$. However, time $t_2$ when pulse $V_8$ is generated occurs after the time when pulse $E_9$ is generated, i.e., at time $t_2$, signal Fvco is in phase lag with respect to signal Fext by over 360°.

A phase comparator such as the one of FIG. 1 is so devised that, when one of its outputs has been rendered active by a pulse at any of its inputs, the comparator is insensitive to any other pulse at this input as long as a pulse at its other input does not deactivate the comparator output. Thus, in FIG. 4, pulse $E_9$ of signal Fext is neglected. It is the next pulse $E'_9$ that is "considered" as being pulse $E_9$. As represented by a short pulse UP corresponding to pulses $E'_9$ and $V_9$, neglecting a pulse of signal Fext is considered as a decrease of the phase error, because the phase error maintains the same sign.

Thus, if the frequency of signal Fvco is not acted upon, independently of the initial conditions, the phase comparator provides, at the end of a given lapse of time (from time $t_1$ in FIG. 4), pulses constantly indicative of the sign of the frequency correlation between signals Fext and Fvco.

Figure 5:
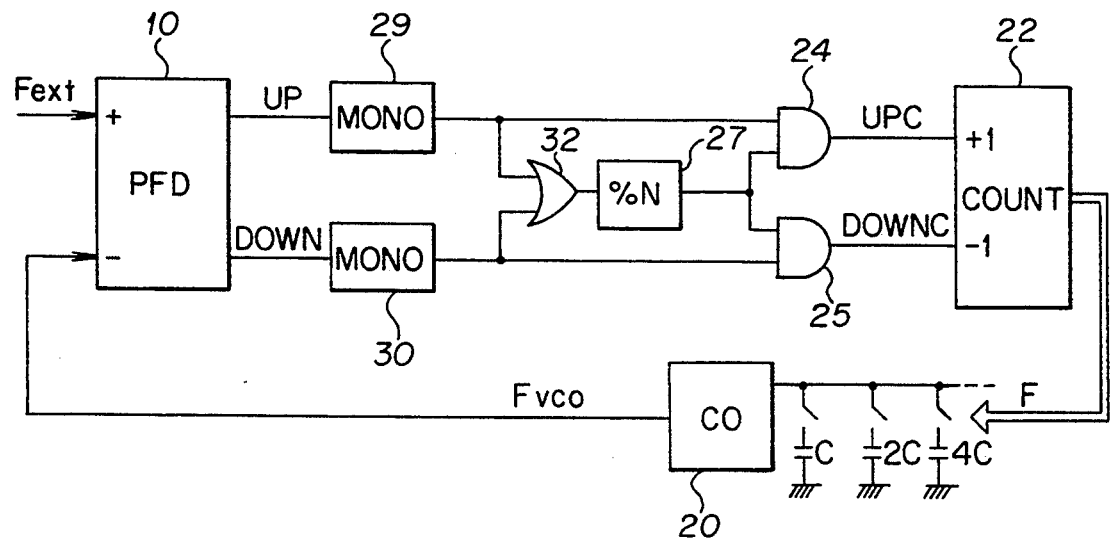
FIG. 5 illustrates an embodiment of a frequency locked loop according to the invention.

FIG. 5 shows a completely integrable embodiment of a frequency locked loop (FLL) according to the invention. FIG. 5 shows again a phase comparator 10, similar to that of FIG. 1, receiving at the input an external signal Fext and a signal Fvco from a controlled oscillator 20 and providing UP or DOWN pulses as a function of the phase relation between signals Fext and Fvco. According to the invention, the frequency of oscillator 20 is determined by a reference value F which is modified only every N UP or DOWN pulses.

In the embodiment of FIG. 5, oscillator 20 is a conventional oscillator oscillating about a quiescent value that can be modified by an array of correction capacitors (C, 2C, 4C...). Reference value F is in the present case digital and each of its bits connects or disconnects a respective capacitor of the array. To perform a variation of the quiescent frequency proportionally to reference value F, each capacitor of the array has a value twice as high as the value of the preceding capacitor. Since the capacitors are simply correcting capacitors, they have low capacitance values and are generally integratable.

The digital reference value F is provided by a counter 22 which has an incrementation input connected to the UPC output of a first AND gate 24 and a decrementation input connected to the DOWNC output of a second AND gate 25. The output of a divider by N, 27, is connected to a first input of each gate 24 and 25. The second input of gate 24 is connected to UP output of comparator 10 through a monostable flip-flop 29. The second input of gate 25 is connected to the DOWN output of comparator 10 through a monostable flip-flop 30. The output signals of flip-flops 29 and 30 are combined in an OR gate 32 prior to being provided to the input of divider 27.

With this configuration, divider 27 receives a signal each time a pulse is provided by comparator 10, either an UP pulse or a DOWN pulse, and generates a pulse at its output at each $N^{th}$ pulse. Thus, at each $N^{th}$ pulse, gates 24 and 25 are conductive. This $N^{th}$ pulse is therefore transmitted through gate 24 to the incrementation input of counter 22 if it is an UP pulse, or through gate 25 to the decrementation input if it is a DOWN pulse. An incrementation of counter 22 causes the frequency of oscillator 20 to increase by one frequency step. A decrementation of counter 22 causes the frequency of oscillator 20 to decrease by one frequency step. The frequency step corresponds to the oscillator frequency variation caused by the switching of the smallest capacitor of the correcting capacitor array (C, 2C, 4C...).

The monostable flip-flops 29 and 30 provide divider 27 and counter 22 with sufficiently wide pulses to ensure the proper operation thereof. Flip-flops 29 and 30 are required only if the UP or DOWN pulses happen to have widths lower than the switching time of gates 24 and 25. Such short pulses incur the risk not to be transmitted to counter 22.

Value N must be adequately determined so that each UP or DOWN sampled pulse is effectively a pulse modifying the content of counter 22 in the proper direction.

Assuming a time $t_0$ in the situation of FIG. 4. At time $t_0$, signal Fvco is in phase advance with respect to signal Fext but has a lower frequency. If signal Fvco is not acted upon, it will be in phase lag with respect to signal Fext at the end of a predetermined number of pulses. At the end of this number of pulses, pulses UP or DOWN indicate the proper frequency relation between signals Fext and Fvco. This number is equal to the ratio between the initial phase shift and the difference in the periods of signals Fvco and Fext. Ideally, number N is equal to this ratio. In practice, number N is chosen higher than the ratio between the nominal frequency of signal Fext and the above mentioned frequency step.

Since the value of counter 22 is modified at each $N^{th}$ UP or DOWN pulse, even if signals Fvco and Fext are in synchronism, a remaining frequency ripple of signal Fvco of three frequency steps appears about the frequency of signal Fext. This remaining ripple is reduced to two frequency steps by doubling the value of N. However, by doubling the value of N, the synchronization speed is decreased. In order to make a satisfactory trade-off between speed and accuracy, divider 27 is devised to be programmable and is initially programmed at value N. A conventional synchronization detection device, for example, then reprograms divider 27 to value 2N.

Figure 6:
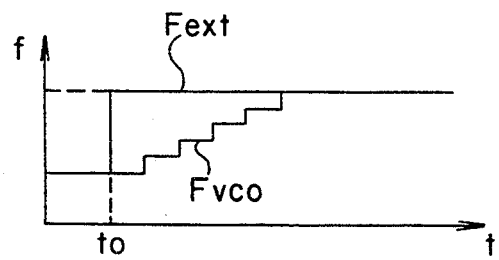
FIG. 6 shows the response waveform of the circuit of FIG. 5 at a frequency step.

FIG. 6 shows the response waveform of signal Fvco for a frequency step of signal Fext. Prior to a time $t_0$, the frequency of signals Fvco and Fext is at an initial value. At time $t_0$, the frequency of signal Fext takes a new higher value. Then, the frequency of signal Fvco constantly and gradually tends to the proper direction up to a new value.

In case of phase shift, the frequency of signal Fvco differs at the most by one frequency step from the initial frequency.

The FLL according to the invention behaves in a much more stable manner than the conventional PLL of FIG. 1 and continuously tends to frequency synchronization substantially independently of any perturbations or the start-up condition of the loop.

The FLL according to the invention can advantageously be used in a television set to assert the middle frequency of a filter for processing the chrominance signal (such as the bell filter in accordance with SECAM standards). This type of filter must be active between the frame retraces, and it can be devised to sharply adjust its frequency during frame retraces. To achieve this purpose, the filter frequency is adjusted by an array of correcting capacitors (C, 2C, 4C...) also serving to correct the frequency of the controlled oscillator of the frequency locked loop. At each frame retrace, the frequency locked loop is activated and supplied by a signal Fext, having as a frequency, the middle frequency that must have the filter (for example the 4.250 MHz chrominance subcarrier in SECAM standards). Thus, during the frame retrace, the capacitor array that determines the filter frequency is suitably adjusted so that the controlled oscillator oscillates at the nearest possible frequency to that of signal Fext. In practice, in such an implementation, it is desired to obtain a precision of the filter frequency of approximately 7 kHz. Hence, a 7-kHz frequency step and a division ratio N of approximately 700 are chosen.

Of course the present invention is liable of variants and modifications which will be apparent to those skilled in the art. More particularly, the various functions of the above described logic circuits can be implemented in numerous alternative manners. For example, divider 27 can be realized in the form of a down-counter whose state is reinitialized to N at each $N^{th}$ pulse; the monostable flip-flops 29 and 30 are then preferably provided.

The invention has been described using digital circuits. If it is not desired to integrate all the components, the functions of the digital circuit can be performed by analog circuits. For example, counter 22 and oscillator 20 can be directly replaced with a charge-pump without any correcting cell (R, C2) controlling a VCO.

Similarly, divider 27 can be replaced with a low value capacitor (therefore integratable) which is charged at a constant value at each UP or DOWN pulse. When the voltage across the capacitor exceeds a determined threshold, the UP or DOWN pulse then occurring is transmitted to counter 22; the capacitor is then simultaneously discharged.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. A frequency locked loop comprising:
   a phase comparator receiving first and second periodic signals and providing, during each period of the first or second periodic signal, a phase error signal representative of a phase difference between the first and second periodic signals;
   an oscillator, coupled to the phase comparator, and providing the second periodic signal to the phase comparator;
   a sampling circuit, coupled to the phase comparator and the oscillator, receiving the phase error signal and providing the phase error signal to the oscillator only at each Nth period of the first or second periodic signal, wherein N is an integer greater than one; and
   a processing circuit, coupled to the oscillator and the sampling circuit, and including a counter receiving the phase error signal, wherein a state of the counter fixes a frequency of the oscillator.

2. A frequency locked loop as claimed in claim 1 wherein the oscillator has a frequency range variable by frequency steps, the first periodic signal has a nominal frequency, and N is selected greater than a ratio between the nominal frequency of the first periodic signal and a frequency step.

3. A frequency locked loop as claimed in claim 1 wherein the phase comparator provides a first output if the first periodic signal is in phase advance with respect to the second periodic signal and provides a second output if the second periodic signal is in phase advance with respect to the first periodic signal.

4. A frequency locked loop as claimed in claim 3 wherein the counter includes an incrementation input and a decrementation input, the sampling circuit provides the phase error signal to the incrementation input when the first output is provided by the phase comparator and provides the phase error signal to the decrementation input when the second output is provided by the phase comparator.

5. A frequency locked loop as claimed in claim 4 further including:
   a divider receiving the first and second outputs of the phase comparator and providing a divided output;
   a first logic gate receiving the divided output and the first output of the phase comparator and having an output coupled to the incrementation input; and
   a second logic gate receiving the divided output and the second output of the phase comparator and having an output coupled to the decrementation input.

6. A frequency locked loop as claimed in claim 5 further including:
   first and second monostable flip flops coupled to the phase comparator and respectively coupled to the first and second logic gates.

7. A frequency locked loop as claimed in claim 5 wherein the divider includes a programmable divider by integer N.

8. A frequency locked loop as claimed in claim 4 wherein the oscillator includes an array of capacitors and switches, the switches coupled to the counter and controlled by the counter.

9. A frequency locked loop comprising:
   a phase comparator circuit receiving first and second periodic signals and providing, during each period of the first or second periodic signal, a phase error signal representative of a phase difference between the first and second periodic signals;
   a frequency controlled oscillator having a frequency variable by frequency steps, coupled to the phase comparator and providing the second periodic signal to the phase comparator;
   digital circuitry coupled to the phase comparator and frequency controlled oscillator, receiving the phase error signal and controlling the frequency of the frequency controlled oscillator such that the second periodic signal substantially achieves phase synchronization with the first periodic signal.

10. A frequency locked loop as claimed in claim 9 wherein the phase comparator provides a first output if the first periodic signal is in phase advance with respect to the second periodic signal and provides a second output if the second periodic signal is in phase advance with respect to the first periodic signal.

11. A frequency locked loop as claimed in claim 10 further including a processing circuit controlling the oscillator, the processing circuit including a counter having an incrementation input and a decrementation input, a state of the counter fixing the frequency of the oscillator, and wherein the sampling circuit provides the phase error signal to the incrementation input when the first output is provided by the phase comparator and provides the phase error signal to the decrementation input when the second output is provided by the phase comparator.

12. A frequency locked loop as claimed in claim 11 further including:
   a divider receiving the first and second outputs of the phase comparator and providing a divided output;
   a first logic gate receiving the divided output and the first output of the phase comparator and having an output coupled to the incrementation input; and
   a second logic gate receiving the divided output and the second output of the phase comparator and having an output coupled to the decrementation input.

13. A frequency locked loop as claimed in claim 12 further including:

first and second monostable flip flops coupled to the phase comparator and respectively coupled to the first and second logic gates.

14. A frequency locked loop as claimed in claim 13 wherein the oscillator includes an array of capacitors and switches, the switches coupled to the counter and controlled by the counter.

15. A frequency locked loop comprising:

means for comparing phase of first and second periodic signals and providing, during each period of the first or second period signal, a phase error signal representative of a phase difference between the first and second periodic signals;

means for providing the second periodic signal, and having a frequency variable by frequency steps; and means, coupled to the means for comparing phase and the means for providing the second periodic signal, receiving the phase error signal, for controlling the frequency of the means for providing such that the second periodic signal substantially achieves phase synchronization with the first periodic signal.

16. A frequency locked loop as claimed in claim 15 wherein the means for comparing includes means for providing a first output if the first periodic signal is in phase advance with respect to the second periodic signal and a second output if the second periodic signal is in phase advance with respect to the first periodic signal.

17. A frequency locked loop as claimed in claim 16 further including means for digitally counting, coupled to the means for providing the second periodic signal, and for fixing the frequency of the means for providing the second periodic signal.

18. A method for substantially synchronizing periodic signals comprising the steps of:

receiving first and second periodic signals;

providing, during each period of the first or second periodic signal, a phase error signal representative of a phase difference between the first and second periodic signals;

providing, with a frequency controlled element, the second periodic signal;

receiving the phase error signal;

providing the phase error signal to the frequency controlled element only at each Nth period of the first or second periodic signal, wherein N is an integer greater than one; and controlling the frequency of the frequency controlled element such that the second periodic signal substantially achieves phase synchronization with the first periodic signal.

19. A method as claimed in claim 18 wherein the step of providing a phase error signal includes the steps of:

providing a first output if the first periodic signal is in phase advance with respect to the second periodic signal; and providing a second output if the second periodic signal is in phase advance with respect to the first periodic signal.

* * * * *